United States Patent

Sypula

Patent Number: 5,268,259
Date of Patent: Dec. 7, 1993

[54] PROCESS FOR PREPARING AN ELECTRODED DONOR ROLL

[75] Inventor: Donald S. Sypula, Penfield, N.Y.

[73] Assignee: Xerox Corporation, Stamford, Conn.

[21] Appl. No.: 961,770

[22] Filed: Oct. 16, 1992

[51] Int. Cl.⁵ .................. G03C 5/00; G03C 3/00; G03G 13/01; G03G 13/04

[52] U.S. Cl. .................. 430/311; 430/14; 430/18; 430/42; 430/48; 430/231; 430/232; 355/243

[58] Field of Search .................. 430/31, 48, 541, 42, 430/231, 232, 18, 14; 355/243

[56] References Cited

U.S. PATENT DOCUMENTS

| | | | |
|---|---|---|---|
| 3,347,724 | 10/1967 | Schneble et al. | 156/151 |
| 3,610,143 | 10/1971 | Greenwood et al. | 101/128.2 |
| 3,632,435 | 1/1972 | Segelta et al. | 117/212 |
| 3,839,083 | 10/1974 | Sihvonen et al. | 117/212 |
| 3,996,892 | 12/1976 | Parker et al. | 118/658 |
| 4,001,466 | 1/1977 | Shaul et al. | 427/96 |
| 4,006,047 | 2/1977 | Brammett et al. | 156/656 |
| 4,098,922 | 7/1978 | Dinella et al. | 427/54 |
| 4,107,351 | 8/1978 | James et al. | 427/43 |
| 4,143,253 | 3/1979 | Wagner et al. | 200/5 A |
| 4,281,056 | 7/1981 | Berke | 430/232 |
| 4,282,307 | 8/1981 | Bruder | 430/232 |
| 4,568,055 | 2/1986 | Hosoya et al. | 346/153.1 |
| 4,666,735 | 5/1987 | Hoover et al. | 427/43.1 |
| 4,868,600 | 9/1989 | Hays et al. | 355/259 |
| 4,888,209 | 12/1989 | Neely | 427/97 |
| 4,894,679 | 1/1990 | Rachwal et al. | 430/48 X |
| 4,915,983 | 4/1990 | Lake et al. | 427/98 |
| 5,142,829 | 8/1992 | Dumas et al. | 430/5 |

FOREIGN PATENT DOCUMENTS 1-99074 4/1989 Japan.

Primary Examiner—John Kight, II
Assistant Examiner—T. Mosley
Attorney, Agent, or Firm—Zosan S. Soong

[57] ABSTRACT

A process for preparing a toner donor roll having an integral electrode pattern involving: (a) providing a cylindrically shaped insulating member; (b) coating the insulating member with a photoresist; (c) patterning the photoresist by exposure to light, resulting in a first photoresist portion corresponding to the electrode pattern and a second photoresist portion corresponding to the remainder of the photoresist; (d) removing the first photoresist portion, thereby exposing the portion of the insulating member to be overlaid with the electrode pattern; and (e) depositing conductive metal on the portion of the insulating member formerly overlaid with the first photoresist portion, resulting in the electrode pattern.

22 Claims, 1 Drawing Sheet

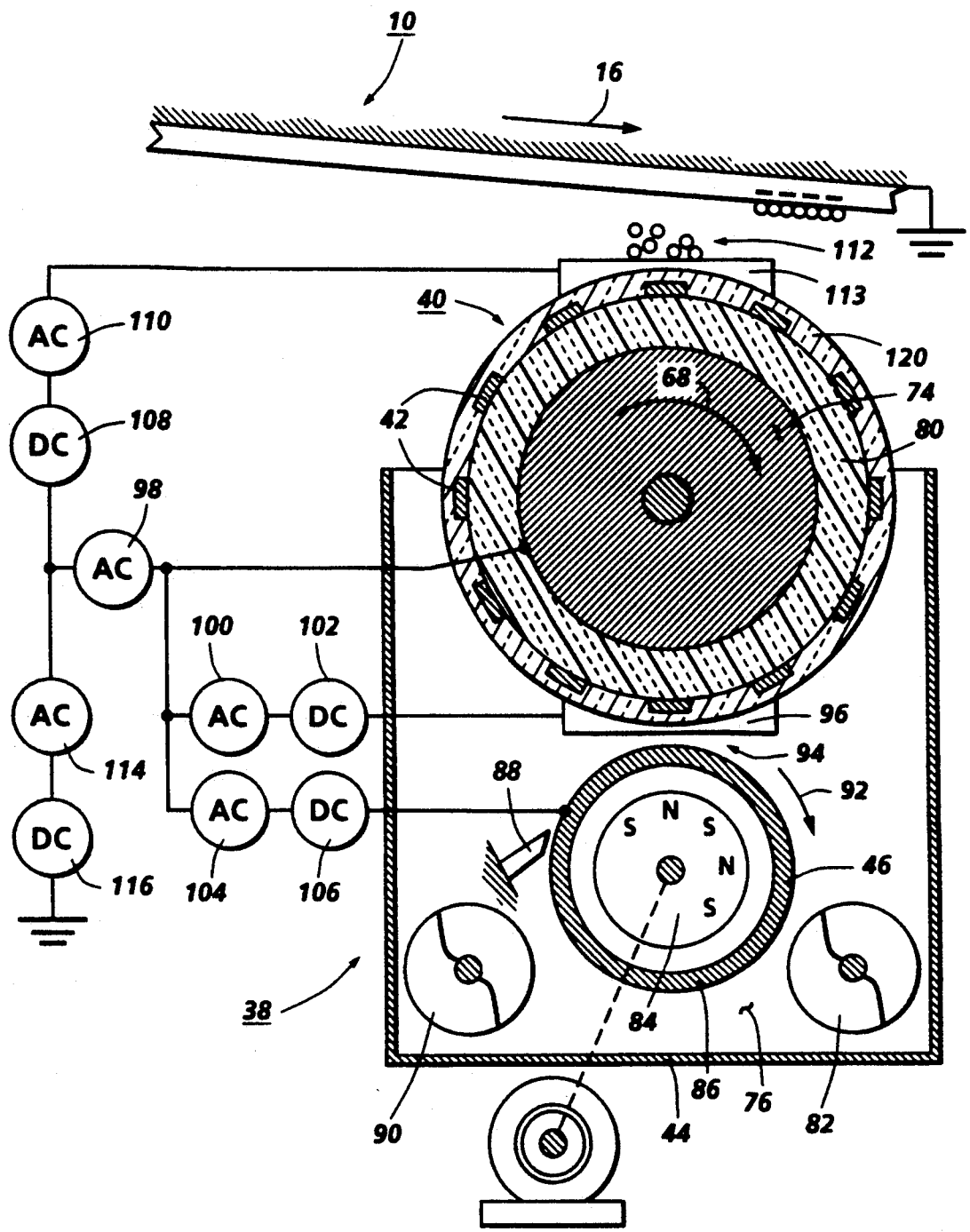

PROCESS FOR PREPARING AN ELECTRODED DONOR ROLL

This invention relates generally to a process for preparing an electroded donor roll or donor rolls, and particularly concerns fabrication of a donor roll having an integral electrode pattern on the surface thereof wherein the electrode pattern is formed by photolithography.

Generally, the process of electrophotographic printing includes charging a photoconductive member to a substantially uniform potential so as to sensitize the photoconductive surface thereof. The charged portion of the photoconductive member is exposed to a light image of an original document being reproduced. This records an electrostatic latent image on the photoconductive member. After the electrostatic latent image is recorded on the photoconductive member, the latent image is developed by bringing a developer material into contact therewith. Two-component and single-component developer materials are commonly used. A typical two-component developer material comprises magnetic carrier granules having toner particles adhering triboelectrically thereto. A single component developer material typically comprises toner particles. Toner particles are attracted to the latent image forming a toner powder image on the photoconductive member. The toner powder image is subsequently transferred to a copy sheet. Finally, the toner powder image is heated to permanently fuse it to the copy sheet in image configuration.

One type of single component development system is a scavengeless development system that uses a donor roll for transporting charged toner to the development zone. A plurality of electrode wires are closely spaced to the donor roll in the development zone. An AC voltage is applied to the wires forming a toner cloud in the development zone. The electrostatic fields generated by the latent image attract toner from the toner cloud to develop the latent image. A hybrid scavengeless development unit employs a magnetic brush developer roller for transporting carrier having toner particles adhering triboelectrically thereto. The donor roll and magnetic roll are electrically biased relative to one another. Toner is attracted to the donor roll from the magnetic roll. The electrically biased electrode wires detach the toner from the donor roll forming a toner powder cloud in the development zone. The latent image attracts the toner particles thereto from the toner powder cloud. In this way, the latent image recorded on the photoconductive member is developed with toner particles. It has been found that for some toner materials, the tensioned electrically biased wires in self-spaced contact with the donor roll tend to vibrate which causes non-uniform solid area development. Furthermore, there is a possibility that debris can momentarily lodge on the wire to cause streaking. Thus, it would appear to be advantageous to replace the externally located electrode wires with electrodes integral to the donor roll.

Various photolithographic processes to deposit conductive metal on a substrate and latent image development apparatuses are known as illustrated by the following: Hoover et al., U.S. Pat. No. 4,666,735; Segeltorp et al., U.S. Pat. No. 3,632,435; James et al., U.S. Pat. No. 4,107,351; Wagner et al., U.S. Pat. No. 4,143,253; Lake et al., U.S. Pat. No. 4,915,983; Hosoya et al., U.S. Pat. No. 4,568,955; Parker et al., U.S. Pat. No. 3,996,892; Brummett et al., U.S. Pat. No. 4,006,047; Sihvonen et al., U.S. Pat. No. 3,839,083; Hays et al., U.S. Pat. No. 4,868,600; Greenwood et al., U.S. Pat. No. 3,610,143; Schneble et al., U.S. Pat. No. 3,347,724; Neely, U.S. Pat. No. 4,888,209; Shaul et al., U.S. Pat. No. 4,001,466; Dinella et al., U.S. Pat. No. 4,098,922; Dumas et al., U.S. Pat. No. 5,141,829; and Japanese Patent Document 1-99074.

In copending Orlowski et al., U.S. application Ser. No. 07/621,687, filed Dec. 3, 1990, now U.S. Pat. No. 5,153,023, there is disclosed a method of forming at least one electrically conductive path in a plastic substrate comprising providing a thermoplastic substrate having a melting point below 325° C., coating said substrate with a precursor of a catalyst for the electroless deposition of conductive metals, said catalyst precursor having a decomposition temperature below the melting point of said thermoplastic and within the temperature range where said thermoplastic softens, heating the portion of said coated thermoplastic substrate corresponding to said conductive path to a temperature sufficient to decompose said catalyst precursor to said catalyst and soften said thermoplastic; said substrate, catalyst precursor and temperature being selected such that on heating to the temperature the precursor decomposes to the catalyst, the thermoplastic softens and at least partially melts without substantial decomposition to enable the catalyst to penetrate the surface of the thermoplastic and become anchored thereto to provide nucleation sites for the subsequent electroless deposition of conductive metal and depositing conductive metal by electroless deposition on said heated portion to form said conductive path. The substrate containing the electrically conductive path may be a planar member, a two-sided circuit board, or a frame or structural member in a machine such as automatic reprographic machines, including office copiers, duplicators and printers.

In copending Hays et al., U.S. application Ser. No. 07/851,411, filed Mar. 13, 1992, now U.S. Pat. No. 5,172,170, there is disclosed an apparatus for developing a latent image recorded on a surface, including: (1) a housing defining a chamber storing at least a supply of toner therein; (2) a moving donor member spaced from the surface and adapted to transport toner from the chamber of said housing to a development zone adjacent the surface; and (3) an electrode member integral with said donor member and adapted to move therewith, said electrode member being electrically biased to detach toner from said donor member to form a cloud of toner in the space between said electrode member and the surface with toner developing the latent image.

In copending Hays, U.S. application Ser. No. 07/724,242, filed Jul. 1991, there is disclosed an apparatus for forming images on a photoconductive surface with toner, said apparatus comprising: a donor member having toner particles thereon; two sets of electrodes arranged such that the electrodes of one of said two sets is interdigited with the other of said two sets; means for applying a DC bias to both sets of electrodes; means for applying an AC bias to at least one of said two sets of electrodes; said AC and DC biases having predetermined magnitudes and being applied in a manner such that AC electrostatic fields are established between adjacent electrodes without DC fields being created therebetween for liberating toner on said donor member for developing toner images on said photoconductive surface without developing background areas.

SUMMARY OF THE INVENTION

It is an object of the present invention to prepare an electroded donor roll by photolithography.

It is an additional object to provide donor rolls and processes for the fabrication thereof.

It is another object to prepare an electrode structure integral with the donor roll.

It is a further object to prepare a donor roll having an electrode structure which is capable of being electrically biased to detach toner from the donor roll to form a cloud of toner for development of a latent image.

It is an additional object to provide devices for electrically biasing the electrode structure to detach toner from the donor roll to form a cloud of toner for development of a latent image.

Still another object is to form an electrode pattern on a donor roll by electroless metal deposition.

These objects and others can be accomplished in embodiments by a process for preparing a process for preparing a donor roll having an electrode pattern comprising:

(a) providing a cylindrically shaped insulating member;

(b) coating the insulating member with a light sensitive photoresist;

(c) patterning the photoresist by exposure to light, resulting in a first photoresist portion corresponding to the electrode pattern and a second photoresist portion;

(d) removing the first photoresist portion, thereby exposing a portion of the insulating member; and (e) depositing conductive metal on the portion of the insulating member where the first photoresist portion has been removed, resulting in the electrode pattern which is capable of being electrically biased to detach toner particles from the donor roll.

BRIEF DESCRIPTION OF THE DRAWINGS

Other aspects of the present invention will become apparent as the following description proceeds and upon reference to the FIGURE which is a schematic elevational view showing a representative development apparatus of an electrophotographic printer/copier device.

DETAILED DESCRIPTION

There is provided a cylindrically shaped insulating member. The insulating member may be of any suitable effective length and diameter and is preferably of a length of from about 13 to about 16 inches and of a diameter of from about 0.75 to about 1.25 inches, and more preferably a length of about 13.130 inches and a diameter of about 0.983 inch. In embodiments, the insulating member may be entirely comprised of an insulating material. Preferably, the insulating member is comprised of a metal core overcoated by a layer of insulating material. The metal core may be any suitable metal including nickel, aluminum, steel, iron, and the like, and mixtures thereof. The insulating material may be any suitable dielectric substance including polymeric compositions comprised of polyamide-imide such as Amoco Torlon Al-10 and Torlon 4203L, both available from Amoco Company, polyurethane, nylon, polyamide, polycarbonate, polyester, polyetherimide, polyimide, polynitrocellulose, polyolefins, such as polyethylene, polypropylene, poly(ethylenevinylacetate), poly-2-pentene, terpolymer elastomer made from ethylene-propylene diene monomer, polyionomers such as Surlyn ®, polyphenylene oxide, polyphenylene sulfide, polysulfone, polyethersulfone, polystyrene, polyvinylidene chloride or fluoride, and the like, and mixtures thereof. The insulating material may be any suitable thermosetting or thermoplastic composition. The insulating material may be comprised of one or more of the components disclosed herein, such as a polyamide-imide, which may be in any effective amount, and preferably in an amount ranging from about 70 to 100% by weight. In the embodiment having a metal core, the layer of insulating material may be of any effective thickness, preferably ranging from about 10 to about 30 microns, and more preferably from about 15 to about 20 microns. The insulating material may be coated on the metal core by any suitable technique including spray coating and dip coating.

In embodiments having a completely dielectric core, the core material may be an extruded tube or solid rod. The void region inside the dielectric tube material may be optionally filled with any suitable composition including rigid polyurethane foam available from isofoam Systems, Inc. The foam may have a density of for example from about 4 to about 25 lbs/cu ft and preferably from about 8 to about 16 lbs/cu ft. The foam may serve to reinforce the tube for mechanical properties and to dampen vibrations which may occur during preparation of the electrode structure on the surface of the tube.

A layer of photoresist is applied to the top surface of the insulating member by any suitable technique. The layer can be of any effective thickness, and preferably from about 1 to about 6 microns thick. The photoresist can be applied to the substrate by a variety of means either in solution, dispersion or neat. When applied as a liquid, either in solution, dispersion or neat, the method of application can be, for example, rod or knife drawdowns, nip roll coating, reverse roll coating, three roll coating, two roll dip coating, knife coating, solution dipping, spray coating, spinning or the like. Other methods of applications such as laminating, calendering and extrusion are possible with heat flowable compositions. When applied as dry resin, such as a powder, the application methods can include spraying, sputtering or dusting or the like. If the photoresist is applied in solution, dispersion or any non-neat liquid, a 100% reactive film can be formed by evaporating solvent with heat or infrared. If it is applied neat, it can be photoimaged directly or, if desired and necessary, converted (cured) to a dry film by exposure to heat or actinic radiation (of different wavelength than that utilized to form a pattern). It is preferable to utilize a curable 100% reactive resin composition which is curable at room temperature by radiation such as ultraviolet radiation, electron beam, x-ray or the like so that curing can be effected without adversely thermally degrading a wide variety of substrates, and solvent evaporation is not an environmental problem.

Any suitable photosensitive composition, especially those which either crosslinks or degrades in response to light, may be employed as the photoresist. Both thermosetting resins and thermoplastic resins can be utilized. The photosensitive composition may comprise one or more components in any effective amounts, and preferably from about 50% to 100% by weight of the resins disclosed herein. Representative examples of thermosetting resins are epoxies and urea- or phenol-formaldehyde based resins. Representative examples of thermoplastic resins are acrylic, urethane, amide, imide, and siloxane based resins. Any combination of the representative polymers in polyblends, copolymers or other composites are suitable. Typical reactive resin compositions for radiation induced free radical polymerization for negative acting resists are composed of photoinitiators; photoreactive prepolymers, such as acrylated urethanes; monomers such as pentaerythritol triacrylate and solvents, such as methyl ethyl ketone, diglyme, N-methyl pyrrolidone. Typical reactive resin compositions for radiation induced ionic polymerizations for negative acting resins are composed of photoinitiators; di- or multi-functional epoxies, such as the diglycidyl ether of Bisphenol A; and in some cases, multifunctional compounds such as diacids, diols and anhydrides. Typical reactive compositions for a photosensitive positive acting resin are composed of novolak resins, orthoquinone diazides, solvents, such as ethylene glycol monomethyl ether or butylacetate. In a preferred embodiment, the photoresist is Microposit S1400 available from Shipley Company Inc.

The photoresist may be patterned into a first portion corresponding to the electrode pattern and a second portion corresponding to the remainder of the photoresist by exposure to light using any suitable technique including exposure to ultraviolet radiation through a line pattern mask, or directly with an electron beam, or a laser. The light may be of any effective wavelength or range of wavelengths including visible light, infrared light, ultraviolet light, x-ray, and the like. Preferably, the light has a wavelength of from about 200 to about 1000 nm, and more preferably from about 300 to about 500 nm. The patterning of photoresist by exposure to light is illustrated, for example, in Lake et al., U.S. Pat. No. 4,915,983, the disclosure of which is totally incorporated by reference.

After light exposure, the photoresist is washed to remove only the portion of the photoresist corresponding to the electrode pattern. Preferably, the photoresist portion corresponding to the electrode pattern is completely removed. The photoresist removed may either be the exposed or unexposed portion, depending on whether the photoresist is of a positive or negative type, i.e., whether the photoresist degrades or crosslinks in response to exposure to light. In a preferred embodiment, the photoresist removed is the exposed portion of the photoresist.

Although the deposit of conductive metal to form the electrode pattern may be accomplished in embodiments without the use of conductive metal nucleating sites, it is preferred to create nucleating sites on the donor roll to facilitate the subsequent deposit of the conductive metal. In one embodiment, after the photoresist is washed to remove only the portion of the photoresist corresponding to the electrode pattern, conductive metal nucleating sites are created on at least the exposed top surface of the insulating member. The process to create the nucleating sites typically creates such sites on both the exposed top surface of the insulating member and on the surface of the remaining photoresist. The nucleating sites on the surface of the remaining photoresist may be removed by a development process which removes all remaining photoresist. Subsequent to the removal of the remaining photoresist, conductive metal is attracted to the nucleating sites, thereby forming the electrode pattern.

The exposed and unexposed portions of the photoresist may be removed by any known technique including removal using an aqueous base solution, aromatic hydrocarbons, alcohols, esters, or ethers, and the like, and mixtures thereof, depending upon the chemical makeup of the photoresist. Preferred photoresist removers are available from the Shipley Company including Microposit MF-319 (comprised of tetramethyl ammonium hydroxide) and Microposit 1165 (comprised of N-methyl pyrrolidone). This process referred to herein as development can be accomplished by a number of known methods such as spraying, dipping, puddle processing, or the like.

Conductive metal nucleating sites may be created in effective amounts by any suitable process including the method illustrated in U.S. Pat. No. 3,632,435, the disclosure of which is totally incorporated by reference. In embodiments, a coating of a colloidal material, in an effective amount, is applied to the substrate to further the sensitization or activation of the same for the deposition, preferably electroless, of a metal, such as copper. The colloidal material applied to the substrate may be selected from colloids conventionally used in the activation of a support for electroless deposition. As described hereafter, the activation of the substrate may be conducted in one or more steps.

When a one step activation procedure is utilized, the surface of the substrate is contacted with an acidic aqueous bath containing an effective amount of a mixture of a noble metal salt and a reducing agent for the noble metal cation. A colloidal material which is catalytic to the metal to be deposited is coated upon the surface of the substrate. Illustrative examples of such baths from which the catalytic colloid may be applied are disclosed in U.S. Pat. No. 3,011,920, the subject matter of which is totally incorporated by reference.

In embodiments, a variation of the single step activation procedure may be employed using an acceleration step such as that illustrated in Shipley, U.S. Pat. No. 3,011,920, the disclosure of which is totally incorporated by reference. A substrate sensitizer containing, for example, stannous chloride was combined with palladium chloride to form a colloidal dispersion of a catalytic metal. Stannous chloride in the combined system also may act as a protective colloid for the catalyst, stabilizing the catalyst against agglomeration and premature precipitation. Excess stannous ions relative to palladium ions may stabilize the catalyst. An optional acceleration step may remove the protective colloid from the catalyst metal after the catalyst metal has been deposited on the substrate and prior to deposition of the conductive metal. The acceleration step may use an effective amount of, for example, an alkaline material or preferably a dilute acid, such as hydrochloric acid, wherein the acceleration step is believed to lead to stronger adsorption and bonding of the conductive metal to the substrate.

Alternatively, an effective amount of a colloidal material such as a metallic salt, capable of reducing a noble cation, e.g., a colloidal stannous salt, may initially be applied from a bath containing the same to coat the substrate. While such a metallic salt alone may be not generally catalytic to the metal which is to be applied, it may subsequently be contacted with an additional bath containing an effective amount of a salt of a noble metal, and the substrate accordingly activated as the cation of the noble metal salt is reduced and deposited upon the substrate at the same location previously occupied by the colloidal metallic salt prior to the oxidation of the cation.

The colloidal metallic salt which is applied to the surface of the substrate is lyophobic, and preferably hydrophobic. Stannous salts, such as stannous chloride (SnCl$_2$), are preferred colloidal materials commonly used in the preparation of a substrate for electroless deposition. Such colloids in effective amounts may be applied to a substrate while suspended in a dilute aqueous hydrochloric acid solution. A colloidal metallic salt, such as a stannous chloride, serves to prepare the surface of the substrate to receive a noble metal. Upon contact with the surface of the substrate, a coating or film of a colloidal material is effectively deposited thereupon. When the surface of the substrate is negatively charged, the colloidal film is not merely deposited thereon, but is electrically attached to the surface.

It is understood that nucleating sites may be created by the use of effective amounts of a noble metal, stannous salts, or mixtures thereof, and the like. In embodiments, stannous salts can form nucleating sites without the use of noble metal salts. Noble metal cations include gold, silver, platinum, palladium, iridium, rhenium, mercury, ruthenium, or osmium, and the like. Suitable counterions to the noble metal cations include acetate and halogens such as chloride and bromide, and the like.

The conductive metal may be deposited by any suitable technique including electroless deposition and/or electroplating as illustrated, for example, in U.S. Pat. Nos. 4,666,735 and 3,632,435, the disclosures of which are totally incorporated by reference. Representative conductive metals include tin, aluminum, iron, steel, nickel, copper, gold, silver, platinum, palladium, and the like.

In preferred embodiments, the surface of the insulating member is pretreated to improve adhesion and/or to provide a uniform metal coating by treatment with plasma or corona discharge to increase critical surface tension, preferably up to about 40 dynes/cm. Corona discharge treatment is illustrated in U.S. Pat. No. 4,666,735 (reference for example col. 6), the disclosure of which is totally incorporated by reference. Corona discharge treatment may be applied to the exposed surface of the insulating member either before application of the photoresist to the insulating member, after removal of the photoresist portion corresponding to the electrode pattern, or both. Any suitable equipment may be used to treat surfaces with corona discharge including Enercon Model A1 corona surface treater available from Enercon Industries Corporation.

In preferred embodiments, after the conductive metal is deposited on the donor roll, additional amounts of the same or different conductive metal is either electrolessly deposited or electroplated on the electrode pattern to increase the line thickness to any effective thickness. The term thickness refers to the depth or height of the electrode lines. For example, to build up a nickel electrode pattern having a line thickness of from about 0.2 to about 2 microns, formed by electroless deposition, additional nickel may be electroplated onto the electrode pattern to increase the line thickness to about 2.5 to about 10 microns. As another example, to build up the line thickness of a nickel electrode pattern formed by electroless deposition, copper may be deposited by electroless deposition onto the electrode pattern. Deposition of additional layers of metal is illustrated in U.S. Pat. Nos. 4,666,735 (reference for example col. 9) and 3,632,435 (reference for example col. 11).

In preferred embodiments, the lines of the electrode pattern may be connected together by a bus bar type contact to ensure electrical connection to each line and from each end for any desired purpose such as for the electroplating of additional conductive metal to build line thickness to any effective height for the electrode pattern. For electroplating additional conductive metal, an electrical contact may be made between the bus connector and the metal core so that electrical connection may be made to the lines of the electrode pattern while the donor roll is mounted in a rotating spindle for the electroplating. A fine wire may be positioned onto the bus connector and the surface of the metal core and preferably at the end of the donor roll or onto the roll shaft. Tape could be used to hold the wire in place, but the adhesive may affect the metal lines during the removal of the tape.

Rather than using an external wire held by tape to electrically connect the bus connector and the metal core, alternatively a small number of fine regularly spaced holes, for example from 1 to about 8 holes of an effective size, may be made in the insulating polymer layer which is underneath the position on the donor roll surface where the bus connector is to be formed by metal deposition. The holes can be made in the cured insulating polymer layer by any suitable method such as by the use of a laser. The laser emits sufficient energy to create the holes by thermal decomposition of the insulating material and vaporization of the decomposition products. Formation of the holes by the laser may be done before the sensitization of the line pattern for metal deposition. Nucleating sites may be created on the line pattern and the side edges of the holes in the insulating material layer down to the metal core. Accordingly, conductive metal would then be deposited on the line pattern, sides of the holes, and on the exposed metal core. This may result in good electrical contact between the bus connector for the lines of the electrode pattern and the metal roll. The roll could then be placed into a spindel which is connected to a power supply for electroplating metal onto the lines to build thickness while the roll is rotated at a low to moderate rate. After the line thickness has been built to an acceptable level, the bus connector and contact to the roll could be removed by dissolving with for example dilute nitric acid solution. This may result in the preparation of isolated metal lines on the surface of the donor roll and they may be of the proper thickness and conductivity for use as electrodes for toner development. The advantage of this method of making electrical contact to the bus connector is that it is simple and eliminates the necessity for placing a wire or connector onto the roll surface which must be held in place by a clamp or tape. Since the contact to the metal core is made beneath the bus bar connector, the end shafts of the donor roll may be protected by an insulating coating except where contact is made to the spindel.

After conductive metal is deposited to form the electrode pattern, the surface of the donor roll is coated with a semi-conductive polymeric material to cover at least the electrode pattern, preferably the entire surface of the roll, for electrical isolation and wear protection for the electrode lines. The semi-conductive polymeric material may be of any suitable composition. For example, the semi-conductive material may be comprised of: (1) a charge transport material such as a phenyldiamine as illustrated in Stolka et al., U.S. Pat. No. 4,265,990, the disclosure of which is totally incorporated by reference; (2) a binder polymer such as polycarbonate; and (3) a charge injecting enabling material which can be carbon in its various forms, metal particles and their oxides and inorganic materials such as metal halides including ferric chloride. Representative charge transport materials, binder polymers, and charge injecting enabling materials are illustrated in Mammino et al., U.S. Pat. No. 4,515,882, the disclosure of which is totally incorporated by reference.

The electrode pattern may be of any effective design which permits the lines of the pattern to be electrically biased to detach toner from the donor roll to form a cloud of toner for development of a latent image with toner. In embodiments, the electrode pattern is comprised of a plurality of spaced lines, parallel to the long axis of the donor roll, arranged about the peripheral circumferential surface of the donor roll. Preferably, the length of each electrode line is at least about half, more preferably from about ¾ to nearly the full length of the donor roll. In embodiments, the lines of the electrode pattern are of any effective width, preferably ranging from about 2 to about 6 mils, and more preferably about 4 mils. In embodiments, the lines of the electrode pattern are of any effective depth, preferably ranging from about 2 to about 10 microns, and more preferably from about 2.5 to about 5 microns in thickness. The lines are spaced apart at effective intervals, preferably ranging from about 4 to about 8 mils, and more preferably about 6 mils.

Referring now to the FIGURE, there is shown a representative developer unit 38. As shown thereat, developer unit 38 includes a housing 44 defining a chamber 76 for storing a supply of developer material therein. Donor roll 40 is comprised of conductive metal core 74, dielectric layer 80, electrical conductors 42 positioned about the peripheral circumferential surface of the roll, and semi-conductive layer 120. The electrical conductors are substantially equally spaced from one another and insulated from the body of donor roll 40 which is electrically conductive. Donor roll 40 rotates in the direction of arrow 68. A magnetic roller 46 is also mounted in chamber 76 of developer housing 44. Magnetic roller 46 is shown rotating in the direction of arrow 92. An alternating voltage source 100 and a constant voltage source 102 electrically bias donor roll 40 in the toner loading zone. Magnetic roller 46 is electrically biased by AC voltage source 104 and DC voltage source 106. Normally both of these voltages are set to zero. The relative voltages between donor roll 40 and magnetic roller 46 are selected to provide efficient loading of toner on donor roll 40 from the carrier granules adhering to magnetic roller 46. Furthermore, reloading of developer material on magnetic roller 46 is also enhanced. In the development zone, voltage sources 108 and 110 electrically bias electrical conductors 42 to a DC voltage having an AC voltage superimposed thereon. Voltage sources 108 and 110 are in wiping contact with isolated electrodes 42 in development zone. As donor roll 40 rotates in the direction of arrow 68, successive electrodes 42 advance into the development zone 112 and are electrically biased by voltage sources 108 and 110. As shown in the FIGURE, wiping brush 113 contacts isolated electrodes 42 in development zone 112 and is electrically connected to voltage sources 108 and 110. In this way, isolated electrodes or electrical conductors 42 advance into development zone 112 as donor roll 40 rotates in the direction of arrow 68. Isolated electrodes, i.e. electrical conductors 42, in development zone 112, contact wiping brush 113 and are electrically biased by voltage sources 110 and 108. In this way, an AC voltage difference is applied between the isolated electrical conductors and the donor roll detaching toner from the donor roll and forming a toner powder cloud. Voltage 108 can be set at an optimum bias that will depend upon the toner charge, but usually the voltage is set at zero. The electroded donor roll assembly is biased by voltage sources 114 and 116. DC voltage source 116 controls the DC electric field between the assembly and photoconductive belt 10 (moving in direction 16) for the purpose of suppressing background deposition of toner particles. AC voltage source 98 applies a AC voltage on the core of donor roll 40 for the purpose of applying an AC electric field between the core of the donor roll and conductors 42, as well as between the donor roll and photoconductive belt 10. Although either of the AC voltages 98 and 110 could be zero, other voltages must be non-zero so that a toner cloud can be formed in the development zone. For a particular toner and gap in the development zone between the donor roll and photoconductive belt, the amplitude and frequency of the AC voltage being applied on donor roll 40 by AC voltage supply 114 can be selected to position the toner powder cloud in close proximity to the photoconductive surface of belt 10, thereby enabling development of an electrostatic latent image consisting of fine lines and dots. It should also be noted that a wiping brush 96 engages donor roll 40 in loading zone 94. This insures that the donor roll is appropriately electrically biased relative to the electrical bias applied to the magnetic roller 46 in loading zone 94 so as to attract toner particles from the carrier granules on the surface of magnetic roller 46. Magnetic roller 46 advances a constant quantity of toner having a substantially constant charge onto donor roll 40. This insures that donor roller 40 provides a constant amount of toner having a substantially constant charge in the development zone. Metering blade 88 is positioned closely adjacent to magnetic roller 46 to maintain the compressed pile height of the developer material on magnetic roller 46 at the desired level. Magnetic roller 46 includes a non-magnetic tubular member 86 made preferably from aluminum and having the exterior circumferential surface thereof roughened. An elongated magnetic 84 is positioned interiorly of and spaced from the tubular member. The magnet is mounted stationarily. The tubular member rotates in the direction of arrow 92 to advance the developer material adhering thereto into a loading zone 94. In loading zone 94, toner particles are attracted from the carrier granules on the magnetic roller to the donor roller. Augers 82 and 90 are mounted rotatably in chamber 76 to mix and transport developer material. The augers have blades extending spirally outwardly from a shaft. The blades are designed to advance the developer material in the direction substantially parallel to the longitudinal axis of the shaft.

In embodiments, the donor roll may be of a scavengeless electrode development (SED) configuration such as illustrated in the FIGURE herein where the electrical potential for the toner cloud generation is applied between the electrodes and the conductive and dielectrically coated metal roll substrate. In embodiments, the donor roll may be alternatively of a scavengeless interdigitated development (SID) configuration such as that illustrated in copending application, U.S. Ser. No., 07/724,242, filed Jul. 1, 1991, the disclosure of which is totally incorporated by reference. In SID configured donor rolls, the electrical potential is applied between adjacent electrodes which are interdigitated for individual electrical connection and supported on a thick dielectric coated metal roll substrate or completely dielectric roll material. The completely dielectric roll material may be an extruded tube or solid rod which is provided with end shafts for mounting in the developer application.

The invention will now be described in detail with respect to specific preferred embodiments thereof, it being understood that these examples are intended to be illustrative only and the invention is not intended to be limited to the materials, conditions or process parameters recited herein. All percentages and parts are by weight unless otherwise indicated.

EXAMPLE 1

The core of the donor roll was a rod comprised entirely of the insulating material Torlon type 4203L resin. The core had a diameter of about 1.0 inch and a length of about 14.75 inches. The surface of the roll was finished by use of a metal diamond cutting tool and buffed with a very fine abrasive cloth to obtain a fine surface finish of about 0.03 mils which was the maximum depth of surface scratches on the roll. The roll was cleaned by wiping with a lintless cotton pad containing heptane solvent and dried at 100° C. for 30 minutes in a forced air oven. The surface of the roll was corona treated by use of the Enercon Model A1 corona surface treater. Four passes of the corona treatment head were made over the surface of the roll at a head to roll spacing of about 0.75 inch. The roll was then coated with Shipley S1400-23 photoresist by dip coating and the coating was dried at about 100° C. for 1 hour. The photoresist was exposed to a 4 mil wide interdigitated line pattern with 6 mil spacing by use of a line mask and ultraviolet light source having a wavelength of from about 350 nm to about 450 nm for 45 seconds each line with 312 total lines. The roll was then processed with Microposit MF-319 developer to remove the photoresist from the exposed line areas. Three deionized water rinses were used after processing in the MF-319 photoresist developer and the roll was dried of excess water by use of an air jet. The roll was placed into a stannous chloride solution comprised of 35.7 g of stannous chloride with two waters of hydration, 30 g of concentrated hydrochloric acid and deionized water to make one liter of solution. The roll was subsequently rinsed with deionized water and placed into a palladium chloride solution comprised of 0.25 g of palladium chloride in one liter of deionized water with 1.0 g of concentrated hydrochloric acid. The sensitization time in the tin and palladium chloride solutions was 5 minutes each. After the tin and palladium chloride solution baths, excess surface water was removed from the roll with an air jet and oven drying at 32° C. for 10 minutes. The roll was immersed into the Microposit 1165 Remover to remove the remaining unexposed photoresist for about 70 seconds, followed by three deionized water rinses. The roll was then placed into the Niklad 797 electroless nickel solution available from the Allied Kelite Division of Witco Corporation. The Niklad 797 solution comprised 10 mL of Niklad 797A and 30 mL Niklad 797B made to a liter volume with deionized water and the solution was heated to 190° F. The nickel metal deposited after about 10 seconds and deposition continued for an additional 2 minutes. The roll was then placed into an electroless copper solution, Coppermerse 20 obtained from Lea Ronal Incorporated, at room temperature (about 25° C.) to increase line thickness. Coppermerse 20 was comprised of 100 mL of Coppermerse 20A, 100 mL of Coppermerse 20B, 1 mL of Coppermerse 20 CP and 800 mL of deionized water. The total time in the electroless copper solution was 2 hours. The electrodes had a width of about 4 mil, spacing of about 6 mil, and a depth believed to be about 0.1 mil.

Other modifications of the present invention may occur to those skilled in the art based upon a reading of the present disclosure and these modifications are intended to be included within the scope of the present invention.

I claim:

1. A process for preparing a donor roll having an electrode pattern comprising:
   (a) providing a cylindrically shaped insulating member;
   (b) coating the insulating member with a light sensitive photoresist;
   (c) patterning the photoresist by exposure to light, resulting in a first photoresist portion corresponding to the electrode pattern and a second photoresist portion;
   (d) removing the first photoresist portion, thereby exposing a portion of the insulating member; and
   (e) depositing conductive metal on the portion of the insulating member where the first photoresist portion has been removed, resulting in the electrode pattern which is capable of being electrically biased to detach toner particles from the donor roll.

2. The process of claim 1, further comprising the following steps between the steps (d) and (e): creating conductive metal nucleating sites on at least the exposed top surface of the insulating member; and removing the second photoresist portion.

3. The process of claim 2, wherein the step of creating conductive metal nucleating sites is accomplished by contacting the surface of the insulating member with a noble metal salt.

4. The process of claim 2, wherein the step of creating conductive metal nucleating sites is accomplished by contacting the surface of the insulating member with: (i) a solution comprised of a noble metal salt and a reducing agent for the noble metal salt cation; or (ii) a composition comprised of the reducing agent for the noble metal salt cation and subsequently, a composition comprised of the noble metal salt.

5. The process of claim 4, wherein the noble metal cation is gold, silver, platinum, palladium, iridium, rhenium, mercury, ruthenium, or osmium and the the reducing agent is a stannous salt.

6. The process of claim 1, further comprising: (f) coating the surface of the donor roll with a semi-conductive polymeric material.

7. The process of claim 6, wherein the semi-conductive polymeric material is comprised of a charge transport material, a binder polymer, and a charge injecting material.

8. The process of claim 1, wherein the step (c) patterns the photoresist by exposing the first photoresist portion to light.

9. The process of claim 1, wherein the electrode pattern corresponds to a plurality of spaced lines, parallel to the long axis of the donor roll, and arranged about the peripheral circumferential surface of the insulating member.

10. The process of claim 1, wherein the electrode pattern is comprised of a plurality of lines having a width ranging from about 2 to about 6 mils, and spaced at an interval ranging from about 4 to about 8 mils.

11. The process of claim 1, wherein the conductive metal is nickel or copper.

12. The process of claim 1, wherein the deposition of the conductive metal is accomplished by electroless deposition.

13. The process of claim 1, further comprising depositing a second conductive metal by electroless deposition onto the electrode pattern.

14. The process of claim 1, further comprising electroplating a second conductive material onto the electrode pattern.

15. The process of claim 1, further comprising applying corona discharge to the surface of the insulating member between the steps (a) and (b), to the exposed portion of the insulating member between the steps (d) and (e), or both.

16. The process of claim 1, wherein the insulating member is comprised of a metal core and a layer of an insulating material.

17. The process of claim 16, wherein the layer of insulating material is a polyimide, a polyamide-imide, a polyester, a polycarbonate, a polyurethane, or a nylon.

18. The process of claim 16, further comprising forming a plurality of holes through the donor roll to the metal core before the step (e), and wherein the step (e) deposits conductive metal on the portion of the insulating member where the first photoresist portion has been removed, and on the side and bottom of the plurality of holes.

19. The process of claim 1, wherein the step (c) patterns the photoresist by exposure to ultraviolet light.

20. The process of claim 1, wherein the insulating member is comprised entirely of an insulating material.

21. A process for preparing a donor roll having an electrode pattern comprising:
  (a) providing a cylindrically shaped insulating member;
  (b) coating the insulating member with a light sensitive photoresist;
  (c) patterning the photoresist by exposure to light, resulting in a first photoresist portion corresponding to the electrode pattern and a second photoresist portion corresponding to the remainder of the photoresist;
  (d) removing the first photoresist portion, thereby exposing the portion of the insulating member to be subsequently coated with the electrode pattern;
  (e) creating conductive metal nucleating sites on at least the exposed top portion of the insulating member;
  (f) removing the second photoresist portion; and
  (g) depositing the conductive metal on the nucleating sites by electroless deposition to form the electrode pattern comprised of a plurality of spaced lines, parallel to the long axis of the donor roll, arranged about the peripheral circumferential surface of the insulating member, and wherein the electrode pattern is capable of being electrically biased to detach toner particles from the donor roll.

22. The process for preparing an apparatus for developing a latent image recorded on a surface, comprising:
  (a) providing a housing with a chamber containing toner therein; and
  (b) providing a rotatable donor roll spaced from the surface and adapted to transport toner from the chamber of the housing to a development zone adjacent the surface, wherein the donor roll is prepared by the steps comprising:
    (i) providing a cylindrically shaped insulating member;
    (ii) coating the insulating member with a light sensitive photoresist;
    (iii) patterning the photoresist by exposure to light, resulting in a first photoresist portion corresponding to the electrode pattern and a second photoresist portion corresponding to the remainder of the photoresist;
    (iv) removing the first photoresist portion, thereby exposing the portion of the insulating member to be coated with the electrode pattern; and
    (v) depositing conductive metal on the portion of the insulating member where the first photoresist portion has been removed, resulting in the electrode pattern which is capable of being electrically biased to detach toner particles from the donor roll to form a cloud of toner particles in the space between donor roll and the surface with detached toner particles from the cloud of toner particles developing the latent image.

* * * * *